United States Patent
Tao

(10) Patent No.: US 9,259,804 B2
(45) Date of Patent: Feb. 16, 2016

(54) HOUSING AND METHOD FOR MANUFACTURING THE SAME

(71) Applicants: SHENZHEN FUTAIHONG PRECISION INDUSTRY CO., LTD., Shenzhen (CN); FIH (Hong Kong) Limited, Kowloon (HK)

(72) Inventor: Nan Tao, Shenzhen (CN)

(73) Assignees: SHENZHEN FUTAIHONG PRECISION INDUSTRY CO., LTD., Shenzhen (CN); FIH (Hong Kong) Limited, Kowloon (HK)

( * ) Notice: Subject to any disclaimer, the term of this patent is extended or adjusted under 35 U.S.C. 154(b) by 312 days.

(21) Appl. No.: 13/939,561

(22) Filed: Jul. 11, 2013

(65) Prior Publication Data
US 2014/0284071 A1   Sep. 25, 2014

(30) Foreign Application Priority Data
Mar. 21, 2013   (CN) .......................... 2013 1 00918061

(51) Int. Cl.
| H05K 5/03 | (2006.01) |
| B23K 26/36 | (2014.01) |
| G06F 1/16 | (2006.01) |
| H05K 9/00 | (2006.01) |

(52) U.S. Cl.
CPC ............ B23K 26/365 (2013.01); G06F 1/1628 (2013.01); H05K 5/03 (2013.01); H05K 9/0067 (2013.01)

(58) Field of Classification Search
CPC ................................. G06F 1/1626; H05K 5/03
USPC ........................... 174/977, 382, 385; 361/799
See application file for complete search history.

(56) References Cited

U.S. PATENT DOCUMENTS

| 2003/0007323 A1* | 1/2003 | Huang .................. G06F 1/1656 361/679.09 |
| 2008/0233390 A1* | 9/2008 | Gothlich ............... C08F 220/06 428/336 |
| 2013/0153427 A1* | 6/2013 | Tatebe ..................... C25D 3/12 D3/12 |

* cited by examiner

Primary Examiner — Dion R Ferguson
(74) Attorney, Agent, or Firm — Novak Druce Connolly Bove + Quigg LLP

(57) ABSTRACT

A permanently-effective element for discharging any accumulation of static electrical charges from the housing of an electronic device includes a main body with an anodized layer formed on the main body. The main body defines a plurality of blind holes of varying shapes and sizes, topped with a layer of conductive paint held in place with a binding film. The incidence of oxidation of the discharging element is significantly reduced and the effectiveness of the discharging element thus improved. A method for manufacturing the housing is also provided.

6 Claims, 5 Drawing Sheets

HOUSING AND METHOD FOR MANUFACTURING THE SAME

BACKGROUND

1. Technical Field

The present disclosure relates to housings and method for manufacturing the housing.

2. Description of Related Art

A metal piece of an electronic device is typically connected to an element having a lower electric potential to allow discharge of electrostatic charges of a metallic housing of an electronic device. The element may be a cell negative pole. However, it can be difficult to securely mount the metal piece to the metallic housing.

Metallic housings made of aluminum, aluminum alloy, or magnesium alloy may be directly electrically connected with the element to discharge electrostatic charges. However, the aluminum, aluminum alloy, or magnesium alloy housings are prone to oxidation, which adversely affect the discharging of electrostatic charges.

Therefore, there is room for improvement within the art.

BRIEF DESCRIPTION OF THE DRAWINGS

Many aspects of the embodiment can be better understood with reference to the following drawings. The components in the drawings are not necessarily drawn to scale, the emphasis instead being placed upon clearly illustrating the principles of the exemplary disclosure. Moreover, in the drawings, like reference numerals designate corresponding parts throughout the several views.

DETAILED DESCRIPTION

Figure 1:
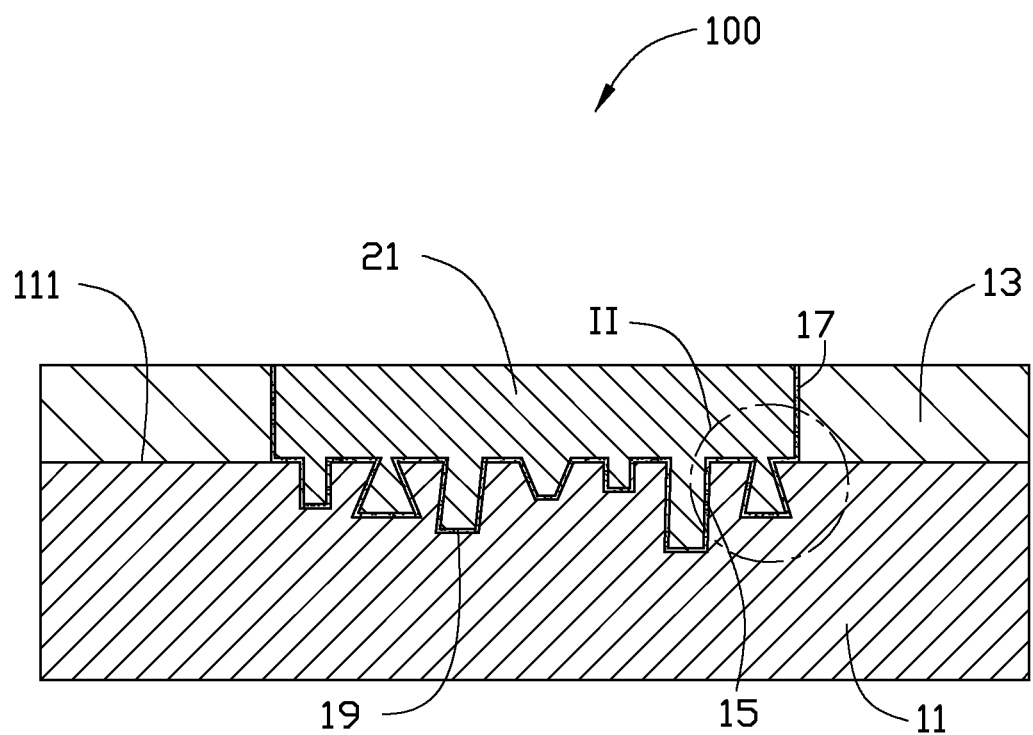
FIG. 1 is a cross-sectional view of an exemplary embodiment of a housing.
Figure 2:
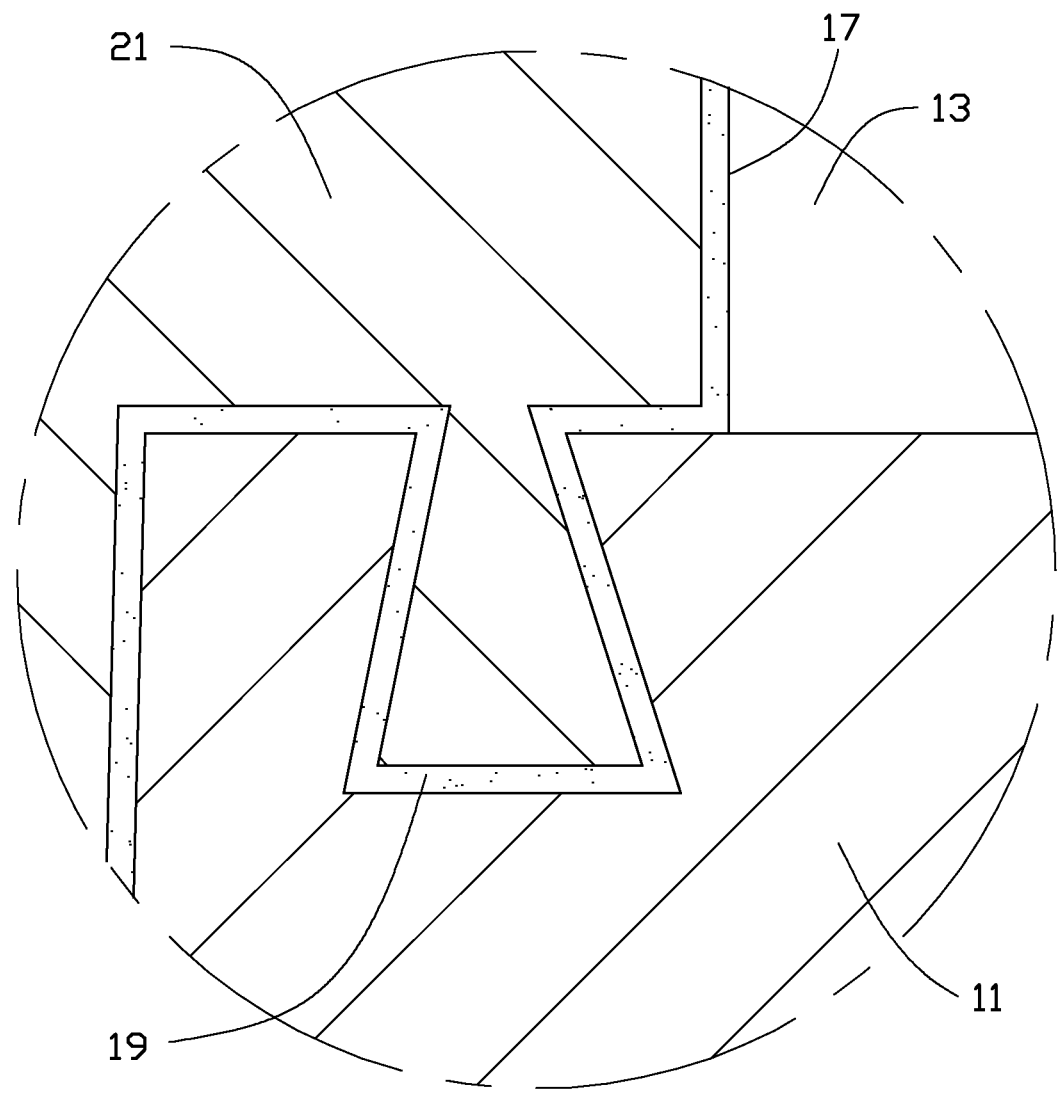
FIG. 2 is an enlarged cross-sectional view of the area contained in the circle II of FIG. 1.

FIG. 1-2 shows a housing 100 according to an exemplary embodiment. The housing 100 includes a main body 11 having a primary surface 111. An anodized layer 13 is formed on the primary surface 111. The main body main body 11 defines a plurality of blind holes 15 therein. The anodized layer 13 does not completely cover the primary surface 111, therefore defining an open area 17 which includes the areas containing the blind holes 15.

The housing 100 further includes a binding film 19 and a conductive paint layer 21. The binding film 19 is formed/deposited on walls of the blind holes 15 and the open area 17. The conductive paint layer 21 is formed on the binding film 19 and fills the empty areas defined by the binding films 19 in the blind holes 15, and the open area 17.

The housing 100 may be a housing of a mobile phone, a personal digital apparatus, or a notebook computer.

The main body 11 may be made of aluminum, titanium, aluminum alloy or titanium alloy.

The anodized layer 13 is formed on the primary surface 111. The anodized layer 13 has a thickness of about 10 μm to about 30 μm.

The plurality of blind holes 15 are defined in the primary surface 111. Each blind hole 15 is in the open area 17. In the exemplary embodiment, at least one blind hole 15 differs from another blind hole 15 in size and/or shape. The longitudinal sections of the blind holes 15 may be varied.

The binding film 19 mainly includes a silane coupling agent. The silane coupling agent may be 3-glycidyloxypropyltrimethoxysilane or amino silane coupling agent.

The conductive paint layer 21 includes at least one kind of conductive particles selected from the group consisting of silver (Ag), cooper (Cu), carbon (C), and aurum (Au). In the exemplary embodiment, the conductive paint layer 21 includes Ag particles. In the exemplary embodiment, the anodized layer 13 fills the blind holes 15 and open area 17. That is, the outer surface of the conductive paint layer 21 is level with the outer surface of the anodized layer 13 which is not covered with conductive paint layer 21.

When the housing 100 is used in an electronic device (not shown), the conductive paint layer 21 is electrically connected to an element (not shown) having a lower electrical potential compared to the housing 100, by a conductor installed in the electronic device. Therefore, the electrostatic charges within the housing 100 can flow into the element to discharge electrostatic charges. The element may be connected to a cell negative pole of the electronic device.

The conductive paint layer 21 and the anodized layer 13 prevent the main body 11 from oxidation, thus the ability of the housing 100 to discharge accumulated electrostatic charges will not be affected. The binding film 19 and the blind holes 15 improve the bond between the conductive paint layer 21 and the main body 11 to prevent the conductive paint layer 21 from peeling, which adversely affects the discharging of electrostatic charges.

Figure 3:
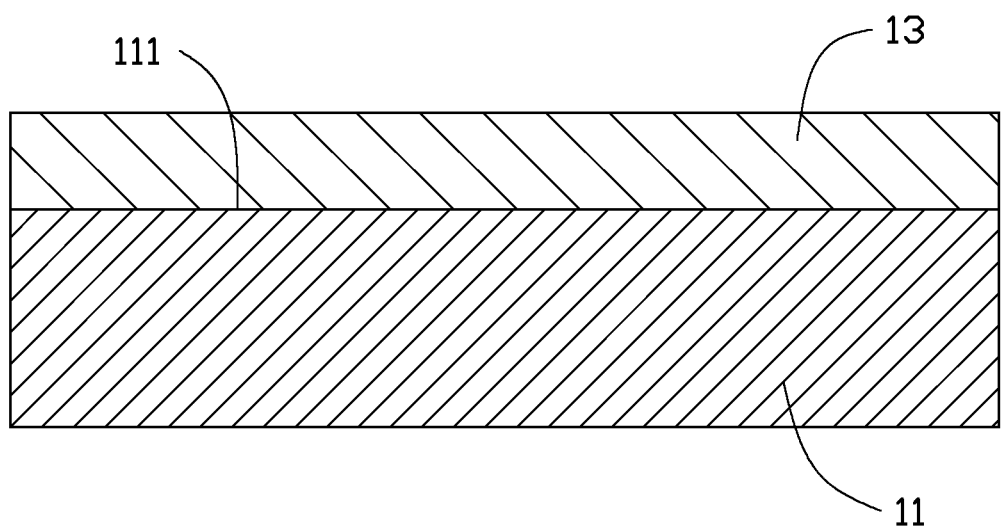
FIG. 3 is a cross-sectional view of a main body coated with an anodized layer.

Referring to FIG. 3, a method for manufacturing the housing 100 is also provided.

(1) The main body 11 is provided.

(2) The anodized layer 13 is formed on the primary surface 111 by an anodizing process.

The anodized layer 13 has a thickness of about 10 μm to about 30 μm.

Figure 4:
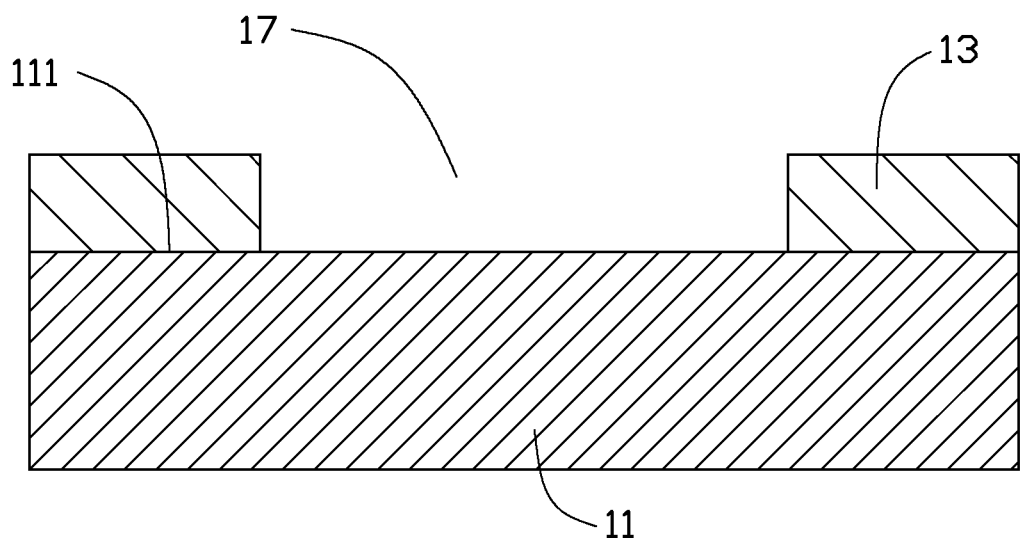
FIG. 4 is a cross-sectional view of the anodized layer of FIG. 3 with an open area.

(3) Referring to FIG. 4, the anodized layer 13 is laser engraved to form an open area 17.

Figure 5:
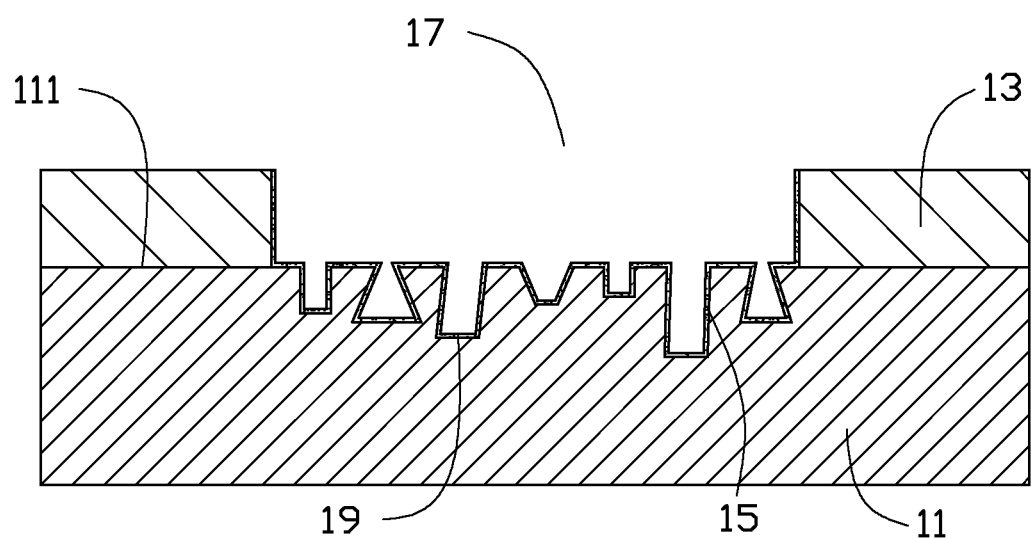
FIG. 5 is a cross-sectional view of the main body of FIG. 4 defining a plurality of blind holes.

(4) Referring to FIG. 5, a laser beam passes through the open area 17 and laser engraves the main body 11 to define a plurality of blind holes 15 in the main body 11.

The blind holes 15 are defined in the primary surface 111 of the main body 11. Each blind hole 15 is in the open area 17. In the exemplary embodiment, a plurality of blind holes 15 with different sizes and/or shapes are defined in the main body 11 by adjusting the burning rate, burning energy, laser power density, and/or other parameters of the laser engraving process. The longitudinal sections of the blind holes 15 may be ladder-shaped, or rectangular.

(5) The binding film 19 is formed on the walls of blind holes 15 and open area 17.

A binding agent is provided. The binding agent includes ethanol and silane coupling agent, wherein the mass ratio of the ethanol and the silane coupling agent is about (1-3):(97-99). The silane coupling agent may be 3-glycidyloxypropyl-trimethoxysilane or amino silane coupling agent.

The binding agent is sprayed on the walls of the open area 17 and blind holes 15. Then, the main body 11 coated with the binding agent is baked at a temperature of about 80° C. to about 85° C. for about 30 min to about 40 min to form the binding film 19.

The conductive paint layer 21 is formed on the binding film 19.

The conductive paint layer 21 includes at least one type of conductive particles selected from the group consisting of Ag, Cu, C, and Au. In the exemplary embodiment, the conductive paint layer 21 includes Ag particles.

The blind holes 15 with different sizes and/or shapes enhance the bond between the conductive paint layer 21 and the main body 11.

During the formation of the binding film 19, the silane coupling agent is prone to hydrolysis and condensation to produce low polymer siloxane which contains Si—OH. When the binding agent adhesives to the surface of the main body 11, the low polymer siloxane will react with metal ions (such as $Ti^{4+}$, $Ni^{2+}$, $Cr^{2+}$, $Al^{3+}$ and $Mg^{2+}$) and form Si—O—M (M may be Ti, Ni, Cr, Al or Mg) groups, which enhances the bond between the binding film 19 and the main body 11. The low polymer siloxane also reacts with organic resin included in the conductive paint layer 21. Therefore, the binding film 19 can further enhance the bond between the conductive paint layer 21 and the main body 11.

It is to be understood, however, that even through numerous characteristics and advantages of the exemplary disclosure have been set forth in the foregoing description, together with details of the system and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A housing, comprising:
   a main body defining a plurality of blind holes;
   an anodized layer formed on the main body, the anodized layer defining an open area, each blind hole being in the open area;
   a binding film formed/deposited on walls of the blind holes and the open area; and
   a conductive paint layer formed on the binding film and filling the empty areas defined by the binding film in the blind holes and the open area;
   wherein at least one blind hole differs from the other blind holes in size and/or shape.

2. The housing as claimed in claim 1, wherein the anodized layer has a thickness of about 10 μm to about 30 nm.

3. The housing as claimed in claim 1, wherein the binding film mainly comprises silane coupling agent.

4. The housing as claimed in claim 3, wherein the silane coupling agent is 3-glycidyloxypropyltrimethoxysilane or amino silane coupling agent.

5. The housing as claimed in claim 1, wherein the conductive paint layer comprises at least one type of conductive particle selected from the group consisting of Ag, Cu, C, and Au.

6. The housing as claimed in claim 1, wherein the outer surface of the conductive paint layer is leveled with the outer surface of the anodized layer which is not covered with conductive paint layer.

* * * * *